United States Patent
Sato et al.

(10) Patent No.: US 7,566,592 B2
(45) Date of Patent: Jul. 28, 2009

(54) METHOD AND PROCESS OF MANUFACTURING ROBUST HIGH TEMPERATURE SOLDER JOINTS

(75) Inventors: Shigeru Sato, Inagi (JP); Jiro Takeda, Machida (JP); Atsushi Kayama, Sagamihara (JP); So Suzuki, Hachioji (JP); Lionel Beneteau, Kolsas (NO)

(73) Assignee: Schlumberger Technology Corporation, Sugar Land, TX (US)

( * ) Notice: Subject to any disclaimer, the term of this patent is extended or adjusted under 35 U.S.C. 154(b) by 14 days.

(21) Appl. No.: 11/552,973

(22) Filed: Oct. 26, 2006

(65) Prior Publication Data

US 2007/0212817 A1    Sep. 13, 2007

Related U.S. Application Data

(60) Provisional application No. 60/767,159, filed on Mar. 7, 2006.

(51) Int. Cl.
*H05K 1/14* (2006.01)
*H01L 21/00* (2006.01)
*H05K 5/00* (2006.01)
*H02B 1/00* (2006.01)

(52) U.S. Cl. .................. 438/123; 361/600; 361/736; 361/743; 361/752; 174/520

(58) Field of Classification Search ............. 438/111, 438/123; 361/743; 174/520
See application file for complete search history.

(56) References Cited

U.S. PATENT DOCUMENTS 4,154,877 A * 5/1979 Vratny ..................... 427/328

6,012,537 A * 1/2000 Rountree et al. ............. 175/40

(Continued)

FOREIGN PATENT DOCUMENTS

WO    2005071750 A2    8/2005

OTHER PUBLICATIONS

Abbott, Donald C., et al. "Whisker Evaluation of PB-Free Component Leads", Texas Instruments Document No. SZZA053, pp. 1-24 (in Japanese With Rough English Language Translation of Abstract).

(Continued)

*Primary Examiner*—George Fourson
*Assistant Examiner*—Phillip Green
(74) *Attorney, Agent, or Firm*—Matthias Abrell; Jaime Castano; Dale Gaudier

(57) ABSTRACT

The principles described herein relate to methods for soldering electrode terminals, pins or lead-frames of commercial electric components for high temperature reliability. In one embodiment, prior to soldering the electric components, a pre-plated solder layer is removed from the lead frame or pins, and nickel and/or gold films are formed with electroless plating. The removal of the pre-plated solder layer avoids excess pre-plated Sn with high-Pb solder that lowers the melting point to between 180° C. and 220° C. and weakens solder joints. The nickel layer formed with an electroless plating acts as a barrier to the interdiffusion of tin from solder with copper of the lead frame material, which may otherwise occur at high temperatures. Interdiffusion forms an intermetallic compound layer of copper and tin and degrades solder joint strength. The novel soldering processes improve high temperature reliability of solder joints and extend electronics life-time.

27 Claims, 6 Drawing Sheets

U.S. PATENT DOCUMENTS

| | | | |
|---|---|---|---|
| 6,246,011 B1 * | 6/2001 | Abraham et al. | 174/260 |
| 7,320,937 B1 * | 1/2008 | Pal et al. | 438/678 |
| 2004/0041241 A1 | 3/2004 | Vo et al. | |
| 2005/0151233 A1 * | 7/2005 | Deepak et al. | 257/677 |
| 2008/0112143 A1 * | 5/2008 | Hanley | 361/752 |

OTHER PUBLICATIONS

Fujita, A., et al., "The Influence of CU Pre-Plating on Lead-Frame to the Solder Joint Strength", Session 2A-1, The 23th Symposium of Nikka Giren Shnraisei Hozen, Jul. 1993, pp. 129-134 (in Japanese With English Language Abstract).

Romm, Douglas W., et al. "Board-Mount Evaluation of Tin-Plated Component Leads", Texas Instruments Document No. SZZA035, Oct. 2002, pp. 1-17.

Romm, Douglas, et al. "Evaluation of Nickel/Palladium/Gold-Finished Surface-Mount Integrated Circuits", Texas Instruments Document No. SZZA048, pp. 1-16 (in Japanese With Rough English Language Translation of Abstract).

Romm, Douglas, et al. "Evaluation of Nickel/Palladium-Finished ICS With Lead-Free Solder Alloys", Texas Instruments Document No. SZZA 052, pp. 1-12 (in Japanese With Rough English Language Translation of Abstract).

Ohyama, Y. et al., "High-Performance Copper Alloy EFTEC-64 and 64T for Lead Frame Applications and Their Properties", Furukawa Denko Jihoh, S62 June (in Japanese With Rough English Language Translation of Abstract).

Anonymous, "Electroless Nickel Plating", Wikipedia, The Free Encyclopedia, URL: http://en.wikipedia.org/wiki/Electroless_nickel_plating.

* cited by examiner

METHOD AND PROCESS OF MANUFACTURING ROBUST HIGH TEMPERATURE SOLDER JOINTS

RELATED APPLICATIONS

This claims priority of U.S. provisional patent application No. 60/767,159, filed Mar. 7, 2006, and entitled "Method and Process of Manufacturing Robust High Temperature Solder Joints."

TECHNICAL FIELD

The present invention relates generally to methods and processes of improving solder joint reliability of commercial electric components that may be used in high temperature environments including, but not limited to, oil wells.

BACKGROUND

Electrode terminals, such as pins or lead-frames of commercial electric components, are usually pre-coated with a suitable solder, nickel/gold, or a nickel/palladium/gold film, to protect the metal surfaces from oxidation and to provide good solderability. The films are designed and optimized for use at the manufacturers' specified temperature ranges. However, sometimes reliability problems of solder joints arise when the electric components are used above the manufacturers' specified temperature range.

Many commercial electrical components, however, are used in high temperature environments. For example, in the oil and gas industry, downhole tools and equipment normally include electrical components that are used in high temperature oil well environments. Oilfield tool designers typically use commercial electrical components because of their ready availability, even though oil well environments significantly reduce the useful life of the electrical components. There are many factors that influence electrical component life. For high temperature applications, one significant factor is the degradation of the solder joint strength. High temperatures can weaken and break solder joints, causing an electrical failure.

SUMMARY

The present disclosure addresses at least some of the above-described needs and others. Some aspects provide soldering methods and processes that improve reliability of solder joints for commercial electrical components needed for use at high temperatures. One method comprises three successive processes. A first process may remove a pre-coated solder layer on the pins, electrodes or lead-frame of a commercial electrical component. A second process may form one or more metal barrier layers on the pins, electrode terminals or lead-frame of the electric component by electroless plating. A third process may include soldering the electrical components to boards with a suitable solder. Certain methods and processes disclosed herein prevent interdiffusion between solder components and pins or lead-frame materials of electric components. Avoiding interdiffusion avoids the formation of fragile intermetallic compound layers that weaken over time and at high temperatures. Some methods also eliminate solder mixing between the pre-plated solder and high melting point solder. Re-coated metal barrier layers can be designed to avoid delamination when used at high temperatures.

One aspect of the methods described herein comprises a cold electro-chemical process that results in little damage to electrical components. Such a method may improve solder joint reliability of commercial electric components and extend the life-time of the electronics used in, for example, high temperature oil wells or other environments. Some methods described herein may also be effective using lead-free soldering, because lead-free solder usually contains more tin than conventional solder.

One embodiment provides a method comprising providing a commercial electrical component having a lead-frame or pins, the lead-frame or pins having a pre-plated solder film; removing the pre-plated solder film on the lead-frame or pins of the commercial electrical component; and soldering the lead-frame or pins. In one embodiment, the method further comprising electroless plating a metallic barrier film on the lead frame or pins of the commercial electrical component prior to soldering. In one embodiment, removing the pre-plated solder film and the electroless plating a metallic barrier film are conducted at less than 100° C. In one embodiment, removing the pre-plated solder film and the electroless plating a metallic barrier film are conducted at approximately 80° C.

One embodiment comprises a method where electroless plating a metallic barrier film comprises electroless plating a Ni barrier film. In one embodiment, the electroless Ni barrier film comprises phosphor in a concentration ranging between about 7 wt % and 10 wt %. In one embodiment the Ni film thickness ranges between about 1 micron and 10 microns. One embodiment further comprises electroless plating an Au film over the Ni barrier film. The Ni barrier film thickness may range between about 1 micron and 10 microns, and the Au film thickness may range between about 100 angstroms and 1000 angstroms.

In one embodiment, the electroless plating a metallic barrier film comprises electroless plating a gold film.

In some embodiments, removing the pre-plated solder film and electroless plating the Ni barrier film comprises: cleaning the lead frame or pins by dipping the commercial electrical component into a cleaning liquid, rinsing with water, etching the lead frame or pins to remove the pre-plated solder film, rinsing with water, washing with an acid, rinsing with water, activating a surface of the lead frame or pins with a chemical liquid, rinsing with water, electroless nickel plating the lead frame or pins, rinsing with water, and drying.

In one embodiment, removing the pre-plated solder film and electroless plating Ni and Au films comprises: cleaning the lead frame or pins by dipping the commercial electrical component into a cleaning liquid, rinsing with water, etching the lead frame or pins to remove the pre-plated solder film, rinsing with water, washing with an acid, rinsing with water, activating a surface of the lead frame or pins with a chemical liquid, rinsing with water, electroless nickel plating, rinsing with water, electroless gold plating, rinsing with water, and drying.

In some embodiments, soldering comprises soldering with a lead-free solder. In some embodiments, soldering comprises soldering with Sn96. In some embodiments, soldering comprises soldering with Sn-3.0 Ag-0.5 Cu. In some embodiments, soldering comprises soldering with high melting temperature solder (for example, 300° C.). In one embodiment, soldering comprises soldering with Pb 95 wt % and Sn 5 wt %. In some embodiments, soldering comprises soldering the commercial electrical component to an oilfield tool suitable for downhole use.

Some embodiments comprise protecting the lead-frame or pins of the commercial electrical component in a fixture having multiple openings. In one embodiment, the fixture comprises a top frame, a bottom frame receptive of the top frame, and multiple nests formed between the top and bottom frame, each of the multiple nests sized to hold an integrated circuit. In one embodiment, each of the top and bottom frame comprises an open webbing, and each of the multiple nests comprises four inward protruding pads arranged at corners of a square.

One method comprises providing a commercial electrical component having a lead-frame or pins, the lead-frame or pins having a pre-plated solder film; removing the pre-plated solder film, electroless plating a metallic barrier film on the lead frame or pins, and soldering the lead frame or pins to another component.

One method comprises providing a commercially available integrated circuit having a lead-frame or pins having a pre-plated solder film, cleaning the lead frame or pins by dipping the device into a cleaning liquid, rinsing with water, etching the lead frame or pins to remove the plated solder film on it, rinsing with water, washing with an acid, rinsing with water, activating a surface of the lead frame or pins with a chemical, rinsing with water, electroless nickel plating, electroless gold plating, and soldering the lead frame or pins to a component of an oilfield tool configured for downhole use.

One aspect provides an apparatus comprising an integrated circuit holding fixture. The integrated circuit holding fixture is configured to hold one or more integrated circuits such that lead frame pins of the one or more integrated circuits are protected from mechanical damage, and open and free to liquids when submersed. In one embodiment, the integrated circuit holding fixture comprises a first skeletal structure, a second skeletal structure receptive of the first skeletal structure, and a first nest disposed between the first and second skeletal structures sized to hold a packaging body of an integrated circuit and not touch the lead frame pins. In one embodiment, the first and second skeletal structures comprise a plurality of nests, each of the plurality of nests comprising an open rectangle formed in the first skeletal structure, and a plurality of radially inward protruding pads. In one embodiment, the open rectangle comprises a square and the plurality of radially inward protruding pads comprises four pads, one arranged at each of the four corners of the square. In one embodiment, the first skeletal structure comprises a plurality of recesses, and the second skeletal structure comprises a plurality of mating posts. In one embodiment the plurality of nests comprise four nests, each nest sized to hold an integrated circuit.

Additional advantages and novel features of the invention will be set forth in the description which follows or may be learned by those skilled in the art through reading these materials or practicing the invention. The advantages of the invention may be achieved through the means recited in the attached claims.

BRIEF DESCRIPTION OF THE DRAWINGS

The accompanying drawings illustrate embodiments of the present invention and are a part of the specification. Together with the following description, the drawings demonstrate and explain the principles of the present invention.

FIGS. 2A-2C illustrate the Xilinx FPGA after a heat cycle test and a shock test. A crack is located at an interface between the lead frame and created metallic compounds.

Figure 1A:
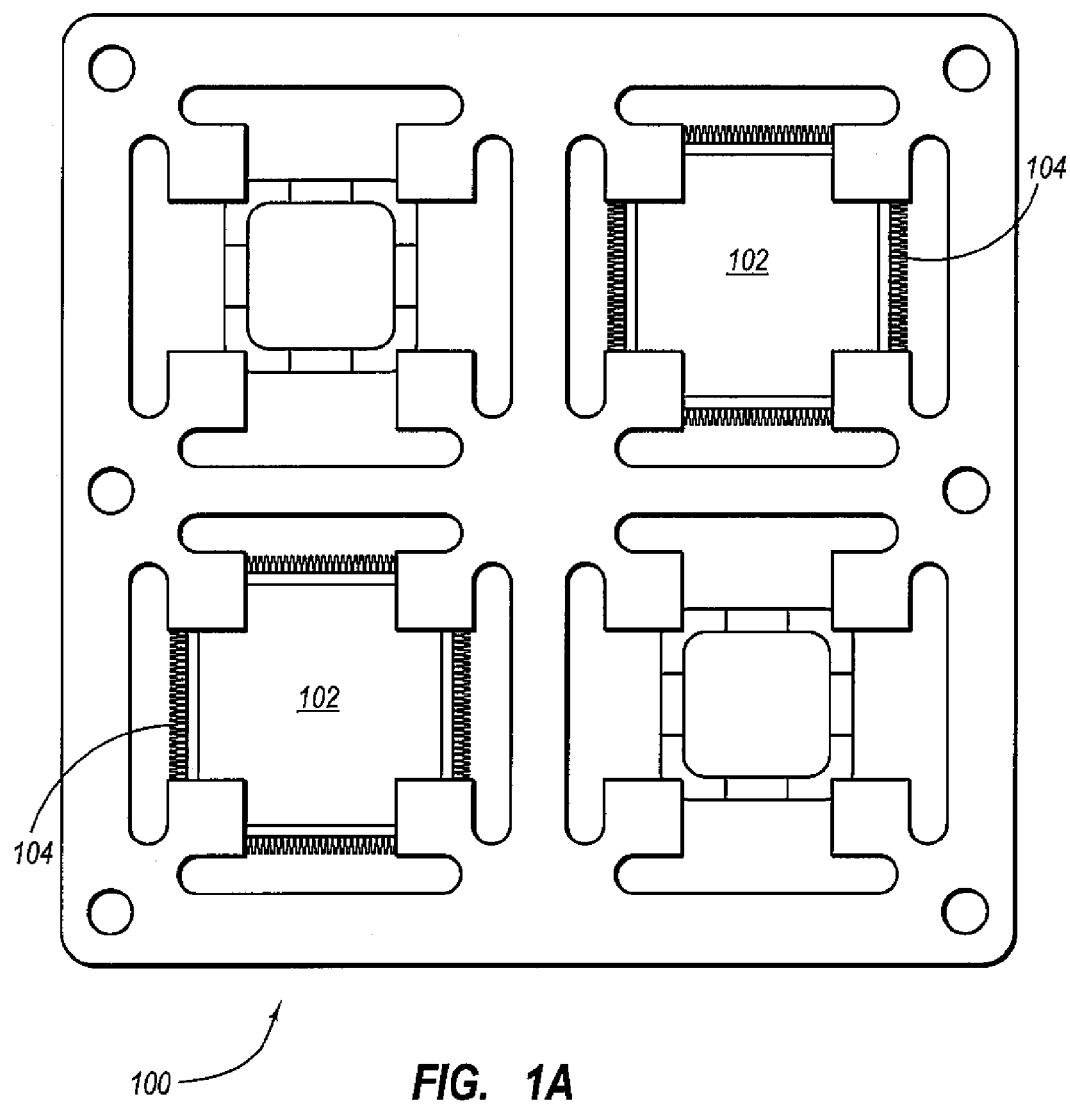
FIG. 1A is a top view of a fixture holding two Xilinx FPGAs (Field-Programmable Gate Array) for use with a Ni/Au plating process. The skeleton structure of the fixture enables one to hold the package body of each device and protect the lead-frame against any mechanical damage during process handling.

Throughout the drawings, identical reference characters and descriptions indicate similar, but not necessarily identical elements. While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the scope of the invention as defined by the appended claims.

DETAILED DESCRIPTION

Illustrative embodiments and aspects are described below. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Reference throughout the specification to "one embodiment," "an embodiment," "some embodiments," "one aspect," "an aspect," or "some aspects" means that a particular feature, structure, method, or characteristic described in connection with the embodiment or aspect is included in at least one embodiment of the present invention. Thus, the appearance of the phrases "in one embodiment" or "in an embodiment" or "in some embodiments" (or "aspects") in various places throughout the specification are not necessarily all referring to the same embodiment. Furthermore, the particular features, structures, methods, or characteristics may be combined in any suitable manner in one or more embodiments. The words "including" and "having" shall have the same meaning as the word "comprising."

Moreover, inventive aspects lie in less than all features of a single disclosed embodiment. Thus, the claims following the Detailed Description are hereby expressly incorporated into this Detailed Description, with each claim standing on its own as a separate embodiment of this invention.

The inventors identified causes of some of the solder joint problems identified above. One cause is degradation of the solder joints due to intermetallic compounds that are formed by an interdiffusion of lead-frame (or pin) materials and solder. The intermetallic compound layers are usually mechanically fragile and weaken the solder joint strength. Another cause is softening of the joint solder when electric components are soldered with a high melting point solder. The electrode terminals or pins of the electric components are usually pre-coated by manufacturers with a low melting point solder. Typical soldering processes for high temperature use include mixing two different kinds of solders, which tends to soften the joint solder at high temperature. Another cause of degraded solder joints is delamination of the pre-coated films, like Ni/Au or Ni/Pd/Au, on the electrode terminals or pins. Delamination occurs when film thicknesses are not properly selected for high temperature (above 175° C.) use.

In order to reduce solder joint problems, one solution is to order specially manufactured electric components with electrode terminals, pins or lead-frames that are pre-coated with films designed for high temperature use. However, expensive fabrication costs make it impractical to specially prepare all the various components that are used in high temperature environments, including those associated with oilfield equipment.

Therefore, according to some embodiments, standard electrical components that may include pre-plated solder film on the electrode terminals and pins may be used by removing the pre-plated solder film. For example, the pre-plated solder film may be removed by washing it away with a high melting point liquid solder. However, such a process includes risks. When liquid solder is at a higher temperature than its melting point, the electronic components may be damaged during the process.

Another solution may be gluing the solder joints of the standard electric components onto a printed circuit board. Gluing may avoid electrical break failures by mechanically holding the electrical contacts even if the solder joints crack. However, it has been found that in some circumstances mechanical holding by gluing does not provide a complete solution to electrical break failures. In general life-time of electrical components is limited by electrical failures due to cracks at the solder joints rather than the intrinsic life of the electric components themselves.

One encountered solder joint problem is associated with the electronics of downhole oilfield measurement equipment including a digital signal processing IC, ADSP2181, manufactured by Analog Devices. The ADSP2181 IC has a fine-pitch lead frame. The manufacturer uses a copper alloy lead frame for better electrical and thermal conductivities in smaller pin cross section than those of the iron alloy lead frames, which are usually used for lower scale integrated circuits and discrete electric components.

In order to study the failure of the soldered connection of the ADSP2181, a heat test and a shock test were conducted on the electronic circuit board. During the shock test, some of the ICs dropped from the electric circuit board. The breakage occurred at the solder joints. However, some of the ADSP2181 devices passed the test. The manufacturer stated that the same copper alloy was used as the lead frame materials of both the successful devices and the failed devices. However, EPMA analysis revealed that the successful and failed devices contained different copper alloys as lead frame material. The failed devices lead frame material was a copper alloy (CDA725) comprised of Cu, 2.26 wt % Sn and 9.05 wt % Ni. The successful devices lead frames included a similar copper alloy (EFTEC64), but was comprised of Cu, 0.25 wt % Sn, 0.2 wt % Zn and 0.3 wt % Cr. The production batches used these different lead frame materials, respectively.

Applicants recognized that the test case cited above was not a special case, as manufactures can use any lead frame materials as long as they can satisfy the manufacturers' requirements below the specified temperature. Problems arise for users who use the standard electronic components beyond the specified temperature, even at the expense of a shorter life-time (such as in high temperature oil well environments).

SEM and element analysis identified some of the causes of failure at high temperatures and shocks. SEM and element analysis revealed mechanical weakness of the intermetallic compounds, $Cu_3Sn$ and $Cu_6Sn_5$, which are formed between the copper alloy lead frame and solder due to interdiffusion at high temperature. The interdiffusion strongly depends on ingredients in the base material and its crystal characteristics like imperfection, grain size and defects. These determine the intermetallic compound thickness and generation of voids (Kirkendall void) in one side layer due to unbalanced diffusion speeds. In any case, thick metallic compound layers and/or Kirkendall void layers degrade the solder joint strength. Applicants' analysis is confirmed by the literature.

One way to solve this problem is by removing the pre-plated solder film and then forming a barrier layer on the copper alloy lead frame (or pins) before the final soldering process. The removal of the pre-plated solder film may be important for the barrier layer because the barrier layer must be formed not on the solder layer that melts or softens at high temperature, but directly on the pin or lead-frame metal. Nickel (Ni) or other materials may perform as a suitable barrier. Nickel is known as suitable barrier layer to the interdiffusion of Cu and Sn, and has been used in printed circuit boards. Advantageously, an electroless plating process can be used to form a nickel barrier layer. An electroless Ni plating technique may be helpful because in some embodiments, lead-frames or pins may be Ni coated on already-assembled electric components (such as like ICs). Ordinary electroplating processes use electric current flow in the metal to be coated, which may damage ICs. Electroless nickel plating, on the other hand, is a cold electro-chemical process, which reduces the risk of or eliminates damage to the ICs. Therefore, principles described herein may be applied to increase solder joint reliability without specifying an initial alloy type for each electrical device lead frame material or pin material. Moreover, processes of removing pre-plated solder and optionally adding additional metal layers can be applied to all types of electric components, especially fine-pitch lead frame ICs, to prevent the solder joint strength degradation problem. Therefore, according to principles described herein, solder joint reliability can be improved for high temperature applications.

One embodiment provides a method comprising providing a commercial electrical component having a lead-frame or pins. The lead-frame or pins may have a pre-plated solder film, which is removed. In some embodiments, the pre-plated solder film is removed by a chemical (cold) process without damaging the electrical component. In one embodiment, the method further comprises electroless plating a metallic barrier film on the lead frame or pins of the commercial electrical component prior to soldering. In one embodiment, removing the pre-plated solder film and the electroless plating a metallic barrier film are conducted at less than about 100° C. In one embodiment, removing the pre-plated solder film and the electroless plating a metallic barrier film are conducted at approximately 80° C.

One electroless nickel plating process that may be used according to the principles described herein is described below. In one embodiment, each electric component (for example, an IC) is immersed in a chemical liquid such as a hyposulfite bath. Nickel and/or gold films are selectively plated only on the metal parts (lead-frame or pins). It has been confirmed that chemical liquids do not damage circuits inside IC packages even if its material is plastic. In many cases, the total process time for the method described below is about one hour. The process may include:

1. Etching the lead frame or pins to remove the pre-plated solder film.
2. Rinsing with water.
3. Washing with an acid (such as sodium persulfate).
4. Rinsing with water.
5. Activating a surface of the lead frame or pins with a chemical liquid (such as sulfuric acid containing palladium).
6. Rinsing with water.
7. Electroless nickel plating.
8. Rinsing with water
9. Electroless gold plating.
10. Rinsing with water.
11. Drying.

In some embodiments, electroless plating of a metallic barrier film includes only one or the other of Ni and Au plating. In others, Ni plating is followed by Au plating. Accordingly, items 9-12 identified above may be mixed, matched, or omitted in part.

There are several electroless nickel plating methods, any of which may be used according to the principles described herein. Nickel plating methods are usually categorized by the types of plating bath: hyposulfite bath, borohydride compound bath, and hydrazine bath. The nickel film plated in the hyposulfite bath generally contains 8 wt % to 10 wt % phosphor. Though the nickel film plated in the borohydride compound bath contains boron, the concentration of boron is low. High purity of nickel film, like the film made with an electroplating method, is desirable, but it is very difficult to plate the film only on metal parts. However, the nickel film in a borohydride bath is plated everywhere, even on plastic parts. Hydrazine baths are rarely used. Nevertheless, nickel film plating by any of the methods identified above may be used. A hyposulfite bath may, however, be easiest to implement.

In some embodiments, a gold film is formed with an electroless plating method after the nickel plating to protect the nickel surface from oxidation. Gold plating may assure satisfactory solderability when the electrical component is soldered to another component and therefore increase resultant reliability. However, a small or minimum film thickness (e.g. approximately 100 angstroms) may be required to avoid mixing with solder and affecting the solder compositions.

One embodiment of one of the processes described above was implemented on an Analog Device DS, ADSP2181. The lead frame made of the same alloy as that of the failed devices (CDA75; Cu, 2.26 wt % Sn and 9.05 wt % Ni) was coated with 1 micron nickel film and 0.1 micron gold film before soldering with a middle melting point (approximately 229° C.) solder (F11; Sn 11 wt %, Pb 75 wt %, Ag 1 wt %, Sb 7 wt %). The ADSP2181 devices passed the same heat and shock tests mentioned above.

Another test was implemented on a Xilinx FPGA, (IC. LOGIC CELL ARRAY MOS HQFP208 100D.M), which has a 208 pin fine-pitch lead frame made with a copper alloy (Cu—Ni—Si). Two test devices were soldered without Ni/Au coating and glued on the solder joints with a suitable epoxy adhesive. Two other devices were soldered on the lead frame coated with nickel (phosphor 7 to 10 wt %, 5 micron thick)/gold (100 angstrom thick) but without any gluing. The solder used was F11. It should be noted that handling the electrical components during the electroless plating process may sometimes cause mechanical damage to the pins and lead-frame of the electronic components. To avoid mechanical damage, the electrical components may be housed in specifically designed fixtures (see, for example, FIGS. 1A-1B).

Figure 1B:
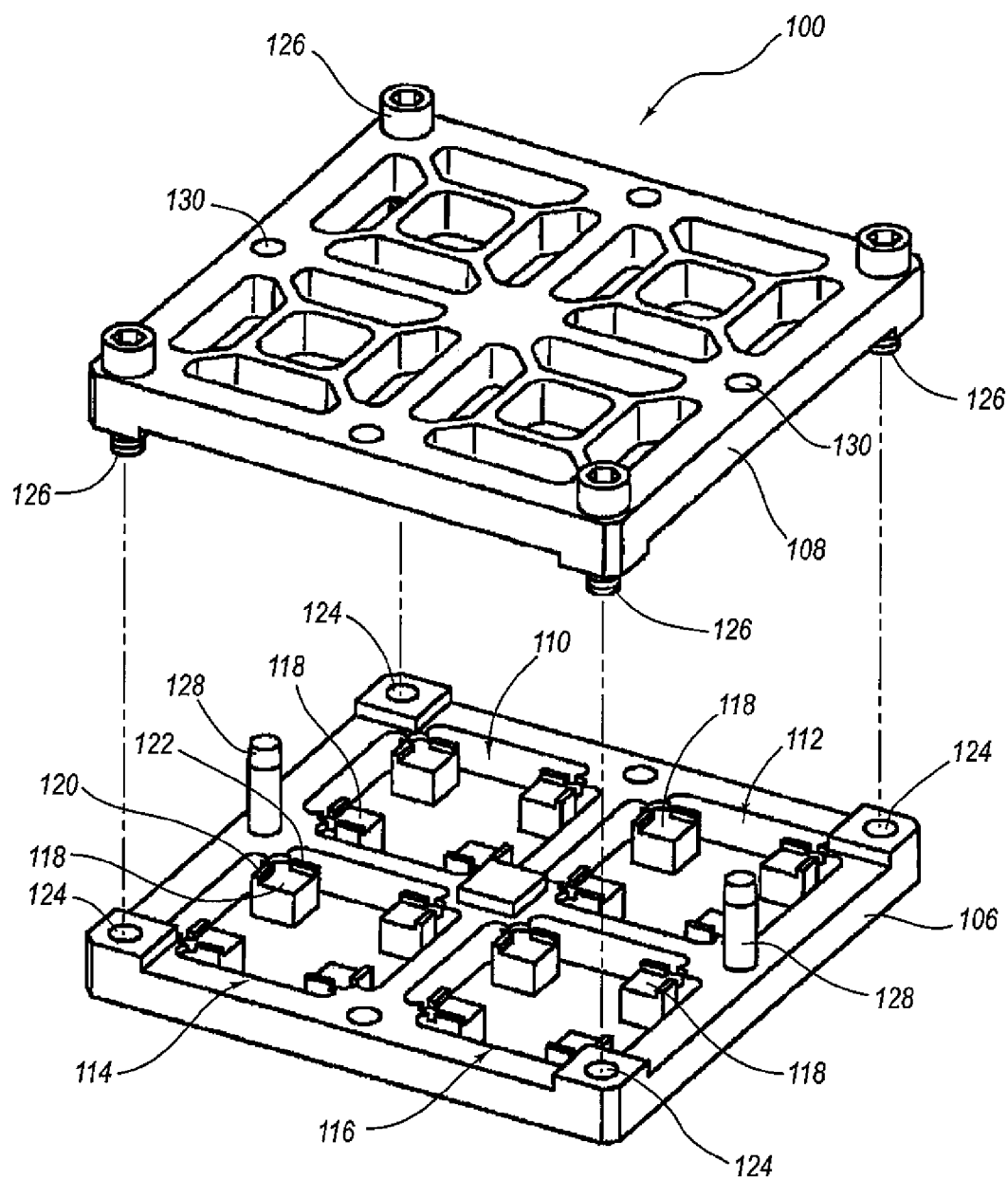
FIG. 1B is a perspective assembly view of the fixture of FIG. 1A, without any FPGAs.

As shown in the embodiment of FIGS. 1A-1B, one embodiment comprises an integrated circuit holding fixture 100. The integrated circuit holding fixture 100 is configured to hold one or more integrated circuits 102 such that lead frame pins 104 of the one or more integrated circuits 102 are protected from mechanical damage, and open and free to liquids when submersed or exposed thereto. In one embodiment the integrated circuit holding fixture 100 comprises a first skeletal structure 106 and a second skeletal structure 108 receptive of the first skeletal structure 106. A first nest 110 disposed between the first and second skeletal structures 106, 108 is sized to hold a packaging body of an integrated circuit (such as integrated circuit 102) and not touch the lead frame pins 104. As shown in FIGS. 1A-1B, the first and second skeletal structures 106, 108 may comprise a plurality of nests such as four nests 110, 112, 114, 116. Each of the plurality of nests 110, 112, 114, 116 may comprise an open rectangle formed in the first skeletal structure 106 and a plurality of radially inward protruding pads 118. The open rectangle of the nests 110, 112, 114, 116 may comprise a square, and the plurality of radially inward protruding pads 118 may comprise four pads, one arranged at each of the four corners of the square. Each protruding pad 118 may include first and second adjacent, outside ridges 120, 122 intended to limit sliding movement of the integrated circuit 102.

In one aspect of the embodiment shown in FIGS. 1A-1B, the first skeletal structure 106 comprises a plurality of recesses 124, and the second skeletal structure 108 comprises a plurality of mating posts or screws 126. In addition or in the alternative, the first skeletal structure 106 may include one or more alignment posts 128 sized to mate with receptive holes 130 in the second skeletal structure 108. The location of the posts 126, 128 and recesses 124 or holes 130 may be arranged in any combination on the first and second skeletal structures 106, 108. In one embodiment, the plurality of nests 110, 112, 114, 116 are each sized to hold a Xilinx FPGA, but any other size and shape specific or generic to any electrical component may also be used.

Figure 2A:
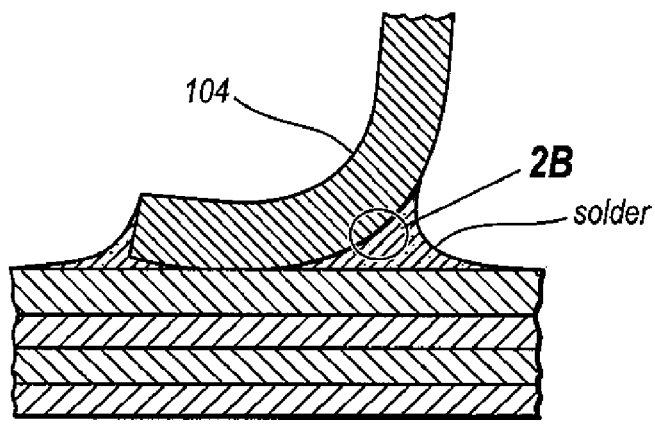
FIGS. 2A-2C are successively magnified views of the Xilinx FPGA with a lead frame and without a Ni/Au coating.
Figure 2B:
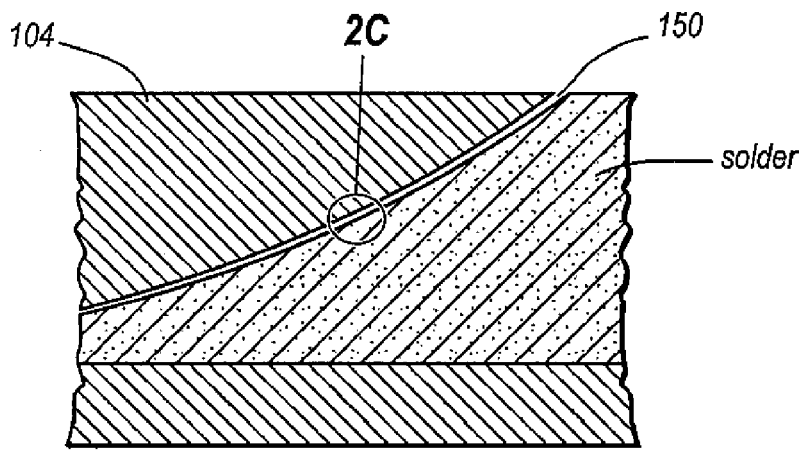
Figure 2C:
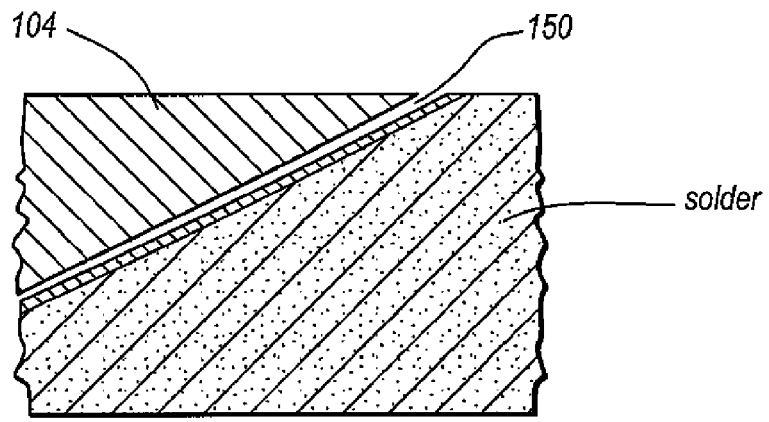

Returning to the testing procedures, the electrical components without nickel and/or gold coating showed intermittent communication problems during the heat cycle test and the problems became severe after the shock test. SEM and element analysis showed that cracks had been created between the intermetallic compound layer and the lead frame (note FIGS. 2A-2C). The intermittent communication problem was due to electrical failures caused by cracks 150 between the lead-frame 104 and the solder. The cracks 150 were confirmed to be the problem when retouching the solder joints fixed the problem.

Figure 3A:
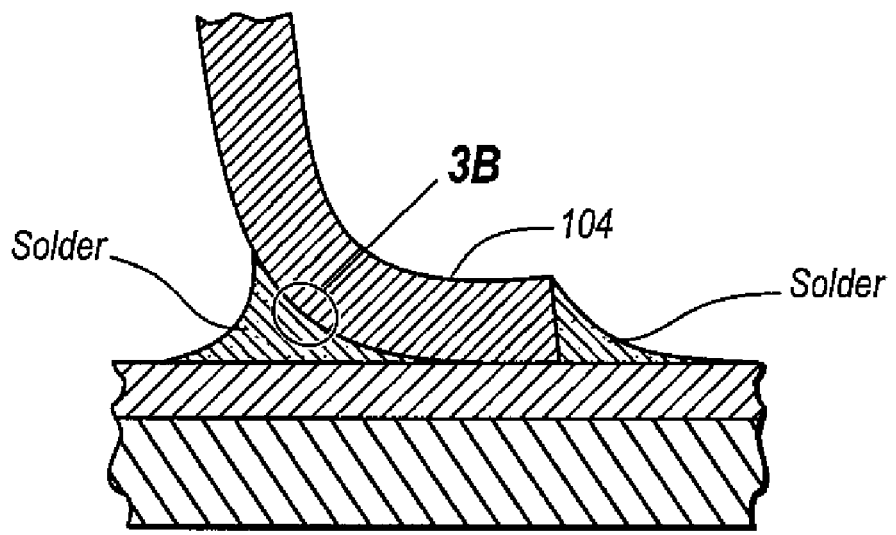
FIGS. 3A-3B are successively magnified views of the Xilinx FPGA with a lead frame coated with Ni/Au, after the heat cycle test and the shock test. There are no cracks. An element analysis identified only a very thin intermetallic compound layer between the nickel layer and the solder. Voids are located at the boundary between the Ni layer and the lead-frame. The voids are created by the electroless Ni plating and do not evolve at high temperature.
Figure 3B:
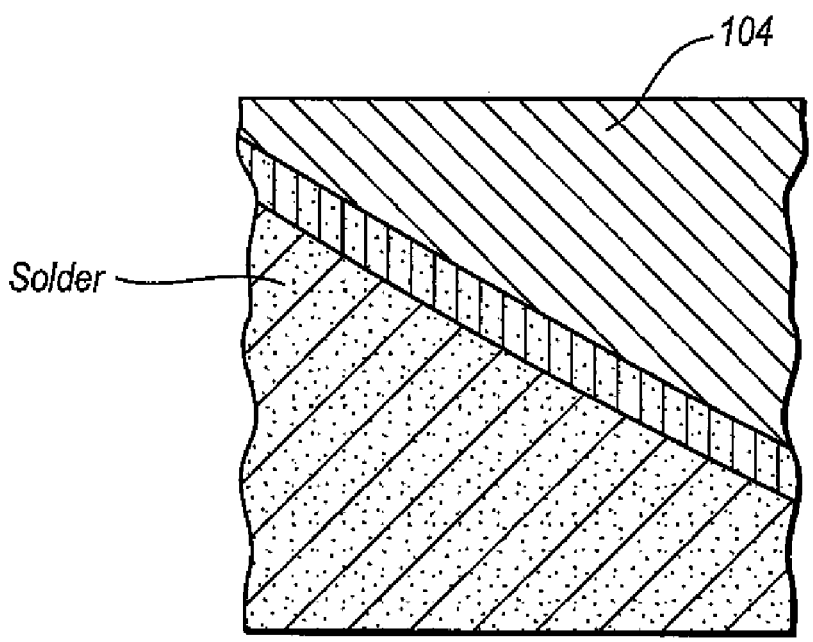

Turning to FIGS. 3A-3B, the electrical components that included the nickel and/or gold coatings passed all the temperature and shock tests. The electrical components functioned completely on the electric circuit boards. SEM and an element analysis revealed no cracks between the lead-frame 104 and the solder. (note FIGS. 3A-3B)

The principles described herein improve solder joints, including any lead-free solders like SN96, Sn-3.0Ag-0.5Cu and so on. Lead-free solders usually contain more Sn than ordinary Pb—Sn solders, and the degradation due to the intermetallic compounds of Cu—Sn is severe. The same Xilinx FPGA was soldered with SN98 after the addition of an Ni/Au coating and maintained functionality at 175° C. for 400 hours. The Xilinx FPGA functioned correctly and SEM analysis observed no cracks at the solder joints. Instead of the barrier layer of Ni/Au, Ni/Pd/Au may also be used, and is more effective for some lead-free solder. Palladium can also be formed with an electroless plating method.

Figure 4:
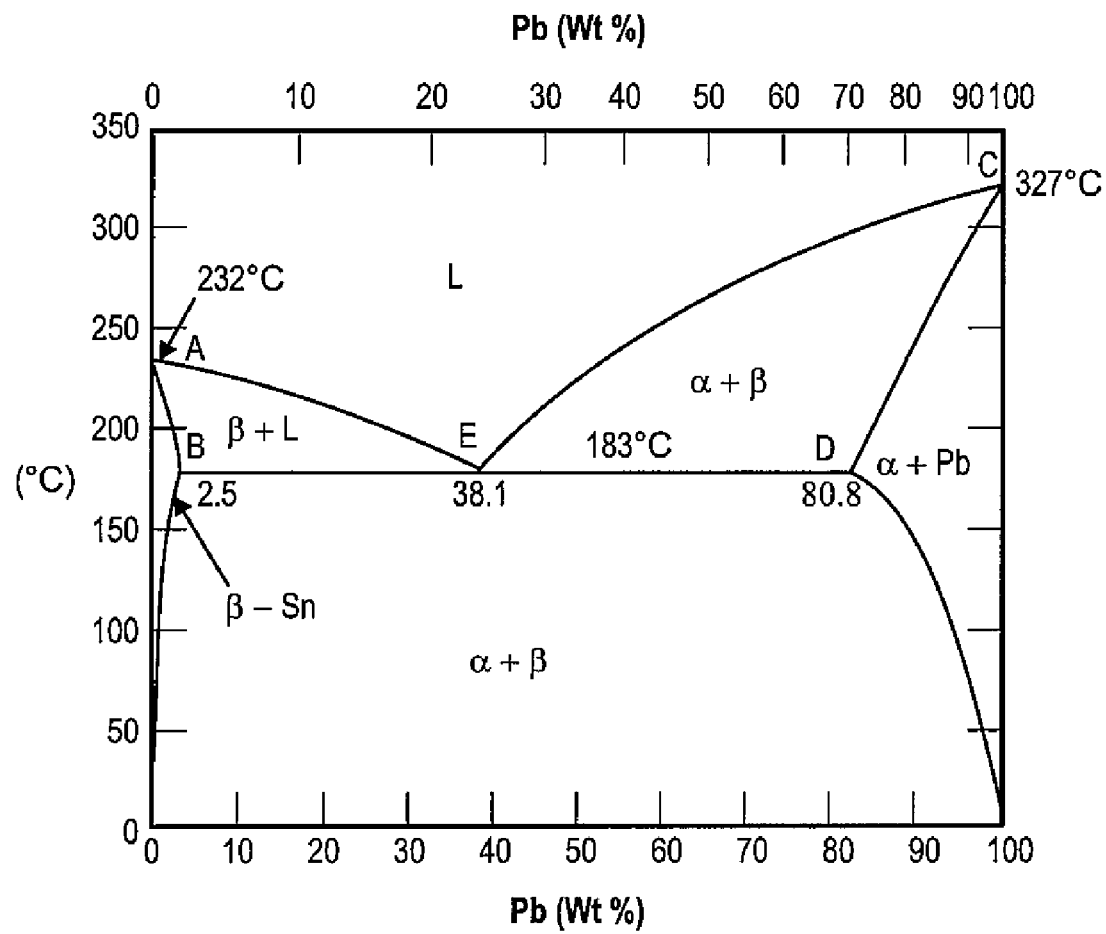
FIG. 4 is a phase diagram of Sn—Pb. A solder with a high temperature melting point may be made from 5 wt. % Sn and 95 wt. % Pb. The solids temperature decreases rapidly with excess Sn contamination and the solder joints may become soft and unreliable at high temperatures.

One test involved a case of mixing excess pre-plated Sn with high-Pb solder (Pb95 wt %, Sn5 wt %), which lowers the solder melting point to between 180° C. and 220° C. (FIG. 4). However, this case may not be suitable for applications exposed to 200° C. external temperatures. A pasty solder joint staying between liquidus and solidus generally cannot provide proper mechanical support to the components when the electrical assembly is exposed to high shock levels at the 200° C. temperature range. Removing excess Sn by a stripping process before solder reflow with high-Pb solder brings back reliability for very high temperature applications including those in downhole oilfield environments.

In addition to the embodiments above, after removing the excess Sn, the electrode terminals or pins may be plated with Ni, Ni/Au, or Ni/Pd/Au for better solderability.

Another embodiment may include electric components with iron alloy lead pins or electrode terminals, which are pre-coated with Ni/Au by component manufacturers for oxidation protection and good solderability. The temperature specifications are usually lower than the temperatures for oil well applications. The pre-coated Ni/Au films are not optimized for such high temperature use and sometimes suffer delamination. The principles described herein allow re-coating of Ni/Au films on pins and electrodes in optimized conditions to extend the electronics life-time in downhole or other high temperature and/or high shock applications.

Figure 5:
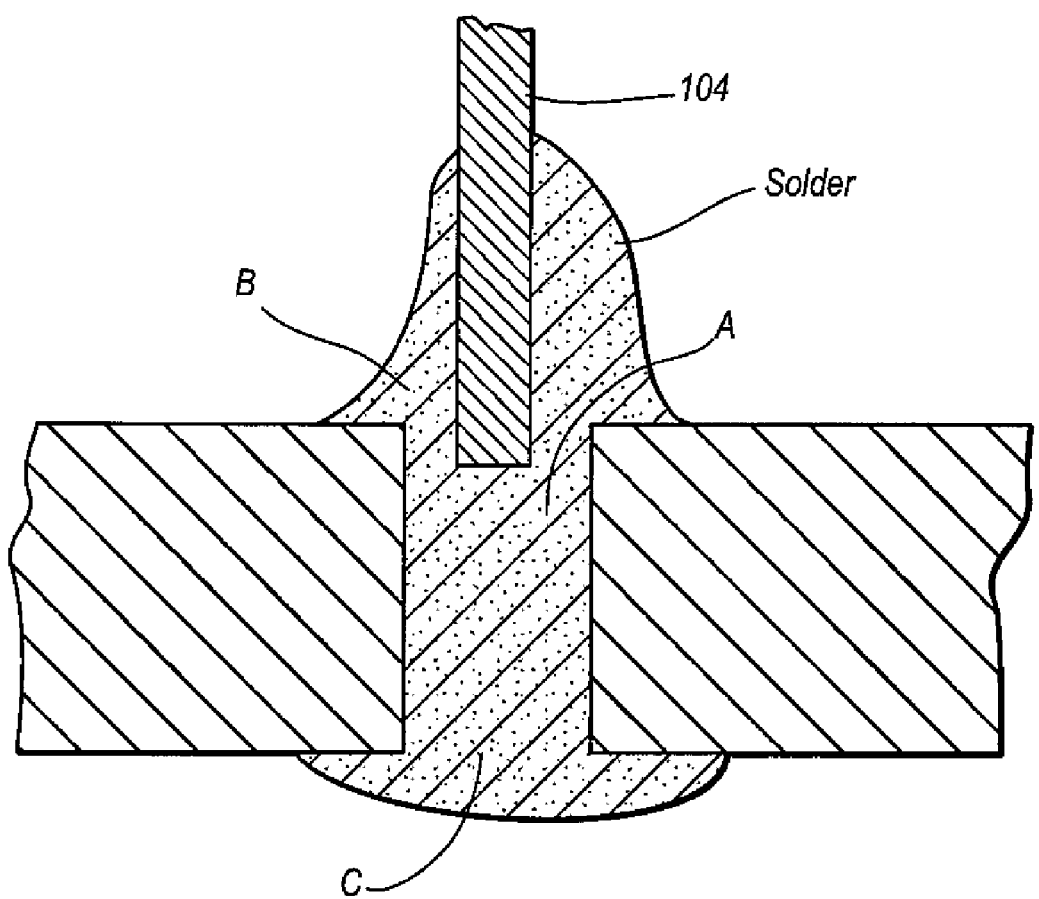
FIG. 5 illustrates high melting point solder (high Pb solder) contamination from Sn plating on the lead frame.

One element analysis illustrated in FIG. 5 revealed that a contamination of a low melting point solder occurred in a high melting point solder. FIG. 5 shows a high melting point solder (Pb 92%, Sn 8%) found at A, and another high melting point solder (Pb 96%, Sn 4%) found at B. However, a low melting point solder (Pb 29%, Sn 68%, Ag 3%) was also found at C. This contamination can be problematic and lead to failures.

According to the principles described herein, it is possible to improve solder joint reliability and to extend electronics life-time at high temperatures in oil wells. In this, downhole equipment can use any electrical components with electrode terminals, pins or lead-frame made of any materials and any pre-coating films. The principles described herein include a cold process so that the components suffer little damage and the process basically costs less because of batch processing.

The preceding description has been presented only to illustrate and describe certain embodiments. It is not intended to be exhaustive or to limit the invention to any precise form disclosed. Many modifications and variations are possible in light of the above teaching.

The embodiments and aspects were chosen and described in order to best explain the principles of the invention and its practical application. The preceding description is intended to enable others skilled in the art to best utilize the principles in various embodiments and aspects and with various modifications as are suited to the particular use contemplated. It is intended that the scope of the invention be defined by the following claims.

What is claimed is:

1. A method, comprising:
   providing a commercial electrical component having a lead-frame or pins, the lead-frame or pins having a pre-plated solder film;
   housing the commercial electrical component in a fixture, wherein the fixture is configured to hold the commercial electrical component such that lead-frame or pins of the commercial electrical component are protected from mechanical damage, and open and free to liquids when submersed or exposed thereto;
   removing the pre-plated solder film on the lead-frame or pins of the commercial electrical component after housing the commercial electrical component in the fixture;
   plating a metallic barrier film on the lead frame or pins;
   soldering the lead-frame or pins.

2. A method according to claim 1, further comprising electroless plating a metallic barrier film on the lead frame or pins of the commercial electrical component prior to soldering.

3. A method according to claim 2, wherein the removing the pre-plated solder film and the electroless plating a metallic barrier film are conducted at less than 100° C.

4. A method according to claim 2, wherein the removing the pre-plated solder film and the electroless plating a metallic barrier film are conducted at approximately 80° C.

5. A method according to claim 2, wherein the electroless plating a metallic barrier film comprises electroless plating a Ni barrier film.

6. A method according to claim 5, wherein the electroless Ni barrier film comprises phosphor in a concentration ranging between about 7 wt % and 10 wt %.

7. A method according to claim 5, wherein the Ni film thickness ranges between about 1 micron and 10 microns.

8. A method according to claim 5, further comprising electroless plating an Au film over the Ni barrier film.

9. A method according to claim 8, wherein the Ni barrier film thickness ranges between about 1 micron and 10 microns, and the Au film thickness ranges between about 100 angstroms and 1000 angstroms.

10. A method according to claim 2, wherein the electroless plating a metallic barrier film comprises electroless plating a gold film.

11. A method according to claim 5, wherein the removing the pre-plated solder film and electroless plating a Ni barrier film comprises:
    etching the lead frame or pins to remove the pre-plated solder film;
    rinsing with water;
    washing with an acid;
    rinsing with water;
    activating a surface of the lead frame or pins with a chemical liquid;
    rinsing with water;
    electroless nickel plating the lead frame or pins;
    rinsing with water;
    drying.

12. A method according to claim 8, wherein the removing the pre-plated solder film and electroless plating Ni and Au films comprises:
    etching the lead frame or pins to remove the pre-plated solder film;
    rinsing with water;
    washing with an acid;
    rinsing with water;
    activating a surface of the lead frame or pins with a chemical liquid;
    rinsing with water;
    electroless nickel plating;
    rinsing with water;
    electroless gold plating;
    rinsing with water;
    drying.

13. A method according to claim 12, further comprising:
    electroless palladium plating;
    rinsing with water;
    before electroless gold plating.

14. A method according to claim 1, wherein the soldering comprises soldering with a lead-free solder.

15. A method according to claim 1, wherein the soldering comprises soldering with Sn96.

16. A method according to claim 1, wherein the soldering comprises soldering with Sn-3.0 Ag-0.5 Cu.

17. A method according to claim 1, wherein the soldering comprises soldering with high melting temperature solder.

18. A method according to claim 1, wherein the soldering comprises soldering with Pb 95 wt % and Sn 5 wt %.

19. A method according to claim 1, wherein the soldering comprises soldering the commercial electrical component to an oilfield tool suitable for downhole use.

20. A method according to claim 2, further comprising protecting the lead-frame or pins of the commercial electrical component in a fixture having multiple openings.

21. A method according to claim 20, wherein the fixture comprises a top frame, a bottom frame receptive of the top frame, and multiple nests formed between the top and bottom frame, each of the multiple nests sized to hold an integrated circuit.

22. A method according to claim 21, wherein each of the top and bottom frame comprises an open webbing, and wherein each of the multiple nests comprises four inward protruding pads arranged at corners of a square.

23. A method, comprising:
providing a commercial electrical component having a lead-frame or pins, the lead-frame or pins having a pre-plated solder film;
housing the commercial electrical component in a fixture, wherein the fixture is configured to hold the commercial electrical component such that lead-frame or pins of the commercial electrical component are protected from mechanical damage, and open and free to liquids when submersed or exposed thereto;
removing the pre-plated solder film after housing the commercial electrical component in the fixture;
electroless plating a metallic barrier film on the lead frame or pins;
soldering the lead frame or pins to another component.

24. A method according to claim 23, wherein the electroless plating a metallic barrier film comprises electroless plating a Ni barrier film and electroless plating an Au film over the Ni barrier film.

25. A method according to claim 24 wherein the electroless plating of Ni and Au comprises:
cleaning the lead frame or pins by dipping the commercial electrical component into a cleaning liquid;
rinsing with water;
etching the lead frame or pins to remove the pre-plated solder film;
rinsing with water;
washing with an acid;
rinsing with water;
activating a surface of the lead frame or pins with a chemical liquid;
rinsing with water;
electroless nickel plating;
rinsing with water;
electroless gold plating;
rinsing with water;
drying.

26. A method according to claim 23, wherein the another component comprises an oilfield tool configured for downhole use.

27. A method, comprising:
providing a commercially available integrated circuit having a lead-frame or pins having a pre-plated solder film;
housing the commercially available integrated circuit in a fixture, wherein the fixture is configured to hold the commercially available integrated circuit such that lead-frame or pins of the commercially available integrated circuit are protected from mechanical damage, and open and free to liquids when submersed or exposed thereto;
etching the lead frame or pins to remove the solder plated film on the lead frame or pins after housing the commercially available integrated circuit in the fixture;
rinsing with water;
washing with an acid;
rinsing with water;
activating a surface of the lead frame or pins with a chemical;
rinsing with water;
electroless nickel plating;
electroless gold plating;
soldering the lead frame or pins to a component of an oilfield tool configured for downhole use.

* * * * *